United States Patent [19]

Brehm et al.

[11] Patent Number: 4,844,047
[45] Date of Patent: Jul. 4, 1989

[54] PROCESS FOR SAWING CRYSTAL RODS OR BLOCKS INTO THIN WAFERS

[75] Inventors: Gerhard Brehm, Emerting; Karlheinz Langsdorf, Burghausen; Johann Niedermeier, Burgkirchen; Johann Glas, Burghausen, all of Fed. Rep. of Germany

[73] Assignee: Wacker Chemitronic Gesellschaft fur Elektronik-Grundstoffe mbH, Burghausen, Fed. Rep. of Germany

[21] Appl. No.: 122,369

[22] Filed: Nov. 19, 1987

[30] Foreign Application Priority Data

Nov. 28, 1986 [DE] Fed. Rep. of Germany ....... 3640645

[51] Int. Cl.$^4$ .............................................. B28D 1/04
[52] U.S. Cl. .................................. 125/13 R; 125/20; 51/383 R; 51/325
[58] Field of Search ................. 125/13 R, 20; 51/267, 51/283 R, 325; 83/171, 72, 169; 30/123.3

[56] References Cited

U.S. PATENT DOCUMENTS 4,484,417  11/1984  Klingerman ........................... 51/267
4,502,459   3/1985  Dyer .................................. 125/13 R
4,513,544   4/1985  Lossi et al. ........................... 51/283

FOREIGN PATENT DOCUMENTS 2359096  6/1975  Fed. Rep. of Germany .

Primary Examiner—Frederick R. Schmidt
Assistant Examiner—Maurina Rachuba
Attorney, Agent, or Firm—Collard, Roe & Galgano

[57] ABSTRACT

A process for the sawing of crystal rods or blocks into thin wafers by internal-hole saws is specified. In this process, the deviation of the saw blade from the intended cutting line, occurring in virtually every sawing operation, is countered by the force of a fluid being applied, at least periodically, to the side surfaces of the blade. This allows the force conditions in the saw cut and thus the deflection of the saw blade, to be influenced. This process results in an improved geometrical quality of the wafers obtained and in prolonged service life of the saw blades which have to be resharpened less often.

12 Claims, 2 Drawing Sheets

PROCESS FOR SAWING CRYSTAL RODS OR BLOCKS INTO THIN WAFERS

BACKGROUND OF THE INVENTION

1. Field of the Invention

This invention relates to a process for the sawing of crystal rods or blocks into thin wafers by means of an internal-hole saw in which a cooling lubricant is applied to the cutting edge of the saw blade during the sawing operation.

2. Description of the Prior Art

Internal-hole saws are predominantly used to saw crystal rods or blocks into thin wafers. The saws are especially useful for cutting semiconductor materials, such as silicon, germanium, gallium arsenide or indium phosphide for example, and additionally, those made of oxidic materials, such as gallium-gadolinium-garnet, sapphire, spinel, quartz or glass. These wafers are typically approximately 0.1–2 mm thick and are used, for example, to produce electronic components or solar cells. With internal-hole cutting saws, the sawing operation is performed by a circular rotating saw blade clamped at its outer periphery in a frame. The actual cutting edge of the saw is formed on the inner rim of the saw blade. The cutting edge is provided with a hard abrasive coating which, for example, is normally diamond or boron nitride grains embedded in a nickel layer. During the sawing operation, the workpiece is placed into the circular inner hole and into the cutting position. The cutting edge is then moved through the workpiece until a wafer of the desired thickness is completely severed away. However, if the sawing is performed using the process according to U.S. Pat. No. 4,513,544, a residual joint remains. In these processes, the cooling lubricant is applied to the cutting edge, preferably from supply lines arranged inside the inner hole, wherein the cooling lubricant serves to both conduct away the heat generated during sawing and to carry away the material removed In general, liquids, such as water, which optionally may contain surfactants such as ethylene glycols, organosilanols or highly sulfated fatty acids, or oils based on paraffin, for example, are used as cooling lubricants. These lubricants are usually provided in a supply tank and pumped via a hose system to the point of use and directed via supply lines to the inner and side surfaces of the cutting edge.

It has been found that as a result of forces acting in the saw cut during each sawing operation, the saw blade deviates from the intended cutting line. This results in the wafers obtained always having a generally undesired flexure (often referred to in the industry as "bow" or "warp"). The deviation becomes even more pronounced with increasing service life, and commensurate blade wear until finally, the tolerances specified for flexure of the wafers can no longer be maintained. When this occurs, the cutting accuracy of the cutting edge can be improved, for example, by briefly sawing into a hard material according to German Auslegeschrift No. 2,359,096 or by resharpening the cutting edge. The disadvantage of this procedure is that the deviation of the saw blade from the intended cutting line cannot be established until evidenced by a deficient product, i.e., with the loss of valuable material.

It is known that with the aid of suitable distance measuring devices, such as eddy current measuring instruments, for example, even minimum deviations of the saw blade with respect to a predetermined target position can be recorded during the sawing operation. However, even using these devices, the cutting path cannot be directly controlled and consequently the losses are reduced only slightly if at all. Moreover, it is sometimes necessary to resharpen the saw's cutting edge several times in succession and to check it by means of control cuts until a satisfactory cutting path has again established itself. Additionally, the saw blades cannot be resharpened indefinitely since each sharpening operation reduces their service life. Aside from the time losses involved, resharpening also necessitates frequent changes of the saw blades.

SUMMARY OF THE INVENTION

It is an object of the invention to provide a process which avoids the material loss associated with the prior art methods and allows the precise sawing of thin wafers within close flexure tolerance, at high yield and with extended saw blade service lives.

It is a further object of the invention to provide a process wherein a fluid is applied, at least periodically, to one or both sides of the rotating saw blade before entry into the saw cut.

Accordingly, these objects are achieved by applying a fluid in a manner wherein the forces and pressure conditions acting in the saw cut on the saw blade can be selectively influenced. The results of applying fluid in this manner are that deviations from the predetermined or intended cutting line can also be countered during the sawing operation.

Fluids which can be used in this process are such liquids or gases which do not cause unacceptable soiling of the workpiece, of the wafers or of the saw blade and behave substantially inertly with respect to the latter during the sawing operation. Therefore, in the case of most semiconductor and oxide materials, aqueous systems are particularly useful. In such systems, for example, pure water or, optionally water to which surfactants or emulsifying agents such as ethylene glycol, organosilanols or highly sulfated fatty acids are added, to avoid disturbances from surface tension effects, may be used as liquids.

In principle, organically-based liquids such as paraffin oils or alcohols, for example, are also suitable. It has often proven expedient to employ the liquid used as the cooling lubricant as the fluid applied to the saw blade as well, as this gives rise to the possibility of jointly collecting the amounts of liquid used during sawing. It is then possible to treat the liquid by separation of the sawing slurry, for example, and to return it again in a circuit to the point of use. In addition, it is equally possible to use gaseous fluids in the process. Air has proven particularly advantageous if only for cost reasons. The use of other gases or gas mixtures, such as nitrogen, carbon dioxide or noble gases such as argon, may optionally be possible.

Part of the fluid applied is passed on by the rotating saw blade into the sawing gap and adds to (in the case of a liquid) or reduces (in the case of a gas) the amount of liquid present in the lateral intermediate space between the saw blade and the workpiece or wafer to be cut. This liquid originates from the cooling lubricant taken into the saw cut via the saw cutting edge. Thus, because of the pressure conditions establishing themselves in the saw cut, the saw blade is always drawn into the side wall of the intermediate space in which there is the largest amount of liquid. If, therefore, a deviation of the saw blade from the desired cutting line is discovered, this effect can be countered by increasing or reducing the pressure differences in the saw cut between the intermediate spaces to the left and right of the saw blade.

Methods for recording the cutting path and the deviation of the saw blade from a predetermined target cutting line are known. For example, the geometry of the severed wafers or the cutting surface on the workpiece, especially with respect to flexure, can be checked for this purpose and counteracted accordingly in the respective subsequent sawing operation. In the preferred process, it has been found advantageous to periodically check the course of the saw blade during the sawing operation. For this purpose, it has been found particularly useful to use eddy current measuring instruments such as are frequently used for distance measurements of moving flat metal surfaces. Optionally, laser-based distance gauges or infrared sensors may be used.

Due to the fast rotation of the saw blade during the sawing operation wherein the rotational speed typically approximates 600 to 4000 rpm, strong radial forces act on the fluids applied to the side surfaces, resulting in the risk that they may be centrifugally expelled before they can have an effect in the saw cut. For this reason, it has proven expedient to apply the selected fluid by directing it, by means of nozzles, to be as precisely parallel as possible to the side surfaces of the saw blade. This results in the fluid coming into contact only with the latter by striking it at an oblique angle in the area just before the saw cut. It is equally advantageous to apply the fluid so that it is directed with respect to the saw blade to be precisely in the horizontal direction in particular or a direction deviating from the horizontal by up to 30°. While nozzles with round cross-sections are preferably used, it is also possible to use nozzles with slit-shaped or angular cross-sections. As a result, openings with a diameter which corresponds to 1 to 50 times the distance between the side surface of the saw blade and the workpiece in the saw cut (mostly approximately 0.1 to 1.5 mm) are provided.

The optimum jetting direction, position and number of nozzles depends substantially on the dimensions of the workpiece. In the case of diameters up to approximately 8 cm, for example, good cutting results can be achieved as a rule with one nozzle. Where larger workpieces are involved, usually more than one nozzle is necessary in order to be able to introduce into the saw cut an adequate amount of fluid for influencing the saw blade. It is expedient to determine the best method for reliably controlling the cutting path by preliminary trials. From these trials, the number of nozzles, their optimum location and the best jetting direction for the fluid can be determined.

Preferably the nozzles are arranged symmetrically on either side of the saw blade, although such an arrangement is not imperative. For reasons of space, for example, an asymmetric arrangement of the nozzles may also be chosen, particularly where multi-bladed internal-hole saws are used. At the extreme, it is even possible to install one or more nozzles on only one side of the saw blade and to control the cutting path by applying a liquid to the side surface when the saw blade moves away from the nozzles and by applying a gas to it when the saw blade moves toward the nozzles.

These and other objects and advantages of the present invention will become apparent from the following detailed description of the accompanying drawing, which discloses one embodiment of the present invention. It is to be understood, however, that the drawing is to be used for the purpose of illustration only, and not as a definition of the invention.

DESCRIPTION OF THE PREFERRED EMBODIMENT

Figure 1:
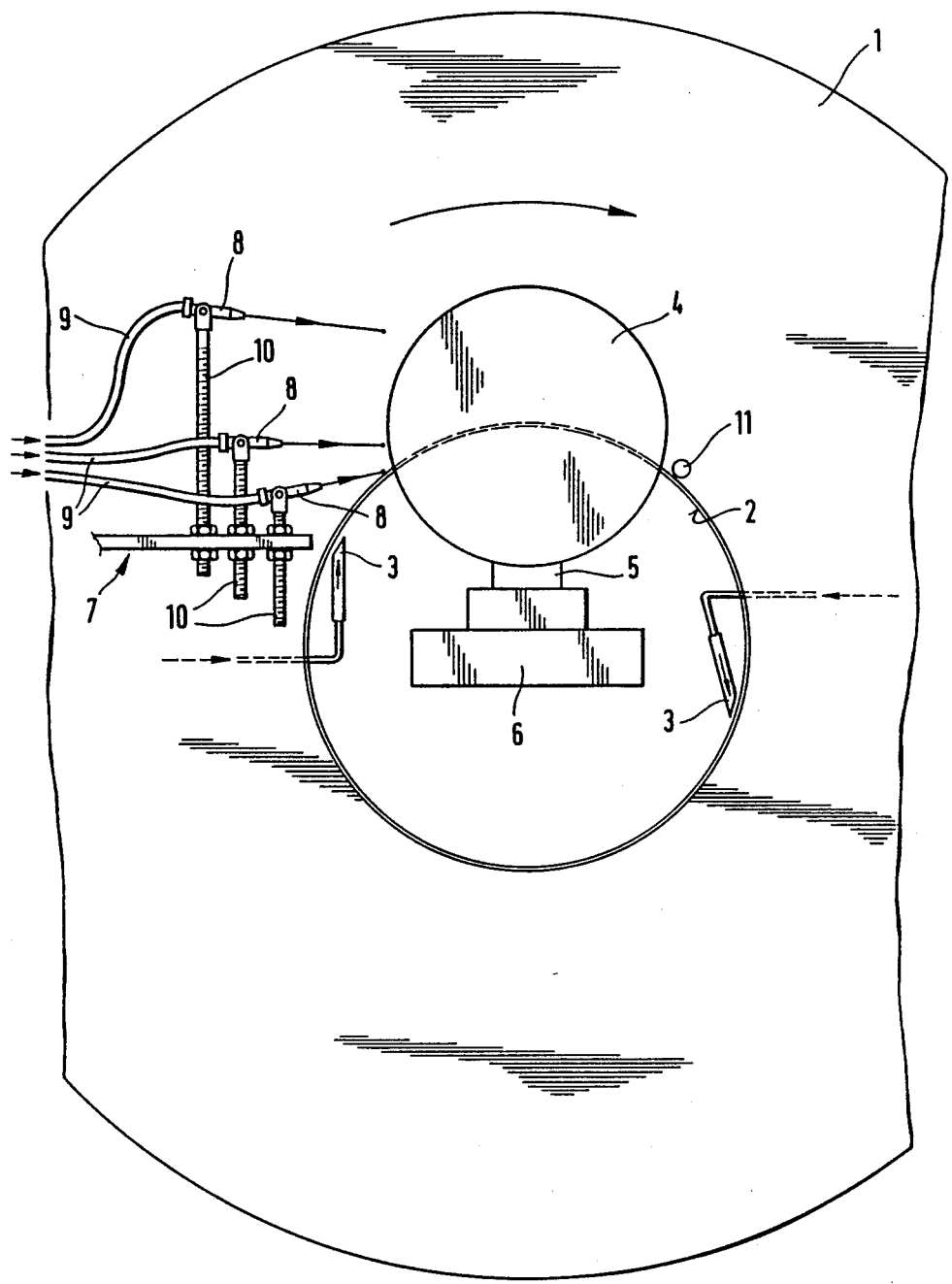
FIG. 1 is a schematic view of the internal-hole saw of the present invention.
Figure 2:
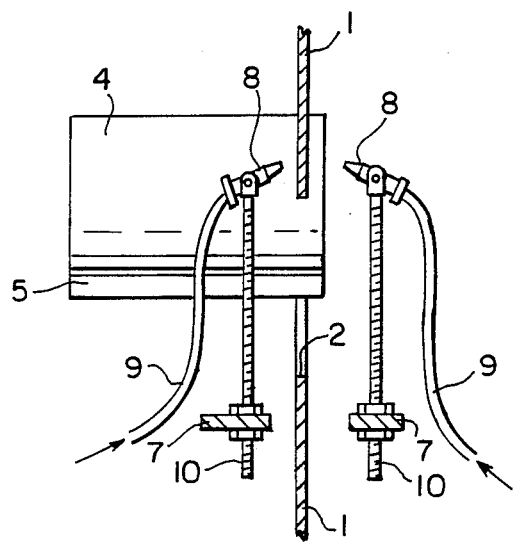
FIG. 2 is a schematic front view of the internal-hole saw of FIG. 1.

Referring to the figures, the inner hole region of a conventional internal-hole saw is schematically represented in cross-section. The saw is additionally equipped with a system of nozzles in order to carry out the sawing operation in the manner according to the invention.

The rotating saw blade 1 (only a section of which is shown), which is clamped in the usual way in a frame (not shown for reasons of clarity), has on its inner circumference a cutting edge 2 consisting of, for example, diamond grains embedded in nickel. This edge is supplied continuously with a cooling lubricant which may be surfactant-containing water via the two supply lines 3.

During the sawing operation, cutting edge 2 works its way through workpiece 4, a silicon rod, for example, which is connected in a known way, such as by means of an adhesively attached carbon strip 5, to infeed table 6. The material removed during sawing is carried out of the saw cut together with the cooling lubricant entrained by the saw blade.

In addition to these well-known elements of internal-hole saws, there is provided in the present arrangement a nozzle system 7 which makes it possible to apply a fluid to the side surface of saw blade 1. In this arrangement, individual nozzles 8, the positions of which can be adjusted, are connected via hoses 9 to a fluid reservoir (not shown). The selected fluid, which, for example, may be pure or surfactant-containing water, can be conveyed from the reservoir by means of pumps or pneumatic pressure, for example, via the hose system to nozzles 8. Flow regulators, such as valves, are advantageously connected upstream to each of nozzles 8 and allow the interruption and optionally, the metering, of the fluid flow.

Nozzles 8 are provided with holders 10, which offer the widest variety of setting capabilities, by which their position and the direction of the fluid jets emanating from them can be adapted to changing workpiece sizes. In a further embodiment of the invention, the arrangement and orientation of the nozzles can be controlled and adjusted during the sawing operation as well. According to the preferred embodiment of the invention, a mirror image of the same nozzle system is provided on the other side of the saw blade.

Nozzles 8 are preferably set in such a way that the jets emanating from them pass virtually parallel to the saw blade and glance its side surface upon impact. The vertical adjustment of nozzles 8 is expediently determined by means of preliminary trials. Generally, however, it has been found advantageous to apply the main amount of the fluid in an area adjoining the cutting edge approximately 0.5 to 5 cm wide.

In some cases, particularly in the case of workpiece diameters of up to approximately 10 cm, the additional application of fluid outside this area may be dispensed with, so that a correspondingly smaller number of nozzles may be used. The axial deflection of the saw blade can be monitored by means of an eddy current measuring instrument 11, for example, which can register deviations from the target position and record them by means of an indicating panel or a plotter.

The actual sawing operation is normally commenced without a fluid being applied to the side surfaces of the saw blade. However, if, as penetration of the workpiece proceeds, the measuring instrument indicates a deviation of the saw blade from the target position which exceeds the allowable tolerance limit, then at least one of the metering valves is opened. Initially, this valve is kept in the closed position and as a rule is the valve controlling the lowest nozzle. The fluid then applied to the saw blade is drawn along by the blade, penetrates at least partially into the saw cut and effects a change in the forces within the cut acting on the saw blade. For example, the saw blade is drawn to the left by application of a liquid via the left-hand nozzle system and to the right via the right-hand nozzle system. In this way, the deviation of the saw blade from the intended cutting line can be countered during sawing. The deviation correction can take place continuously, for example, by means of the eddy current measuring instrument.

When the saw blade has moved back into the desired position, the set volumetric flow of the fluid is maintained until a renewed deviation from the intended cutting line is established. In the event of deviation in the opposite direction, a corresponding response is then possible with the nozzles located in symmetric position on the other side of the saw blade. A simultaneous action of both nozzle systems is also possible.

It is sufficient at the beginning of the sawing operation, i.e. with a small penetration depth of the cutting edge into the workpiece (just as in many cases with workpiece diameters of up to approximately 8 cm) to apply the fluid just by means of one nozzle per saw blade side. However, as a rule, two or more nozzles are required with larger workpieces, particularly toward the end of the cut. At the same time, different fluids can also be used via the different nozzles.

Regulation of the necessary volumetric fluid flows can take place manually in accordance with the cutting path, via the metering valves. In an alternate embodiment of the invention, the valves may be automatically controllable, for example, motor-driven, with the result that the process can be substantially automated. This automation may be accomplished, for example, by the use of a computer control system which in each case compares the actual position of the saw blade with the target position and regulates the volumetric fluid flows accordingly.

Where the cutting properties of the saw blade have already deteriorated to such an extent that it can no longer be kept in the intended cutting line, even by means of the process according to the invention, the cutting edge may be resharpened in the known manner. After sharpening, a satisfactory cutting path can again be ensured as a rule (except where the cutting edge is already too severely worn) by at least periodic application of a fluid to the cutting surfaces.

The process according to the invention makes it possible to saw crystal rods or blocks into thin wafers, particularly rods or blocks made from semiconductor or oxide materials, by means of an internal-hole saw or cutting wheel, with increased precision compared with the usual methods. With this process, it is not only possible to keep the flexure of the wafers (bow or warp) within close tolerance limits, but also to saw wafers of a certain defined flexure. Furthermore, since the process also necessitates considerably less sharpening interventions, the saw blade service life can be markedly increased. Moreover, conventional internal-hole saws can also be retrofitted with the system of the present invention without any problems, irrespective of the saw blade diameter. This applies both to arrangements with vertically or horizontally rotating saw blade and arrangements in which the workpiece also executes a rotation or oscillation during sawing.

The invention will now be explained more fully in two examples which are, however, only given by way of illustration and not of limitation.

EXAMPLE 1

A conventional internal-hole saw (saw blade diameter approximately 680 mm, inner hole diameter approximately 235 mm) with a saw blade clamped at the outer periphery in a frame is provided. The blade has a diamond-set inner circumference, to which a constant stream of a cooling lubricant (wetting agent/water mixture) can be applied during the operation by means of two supply lines arranged according to the figure. Additionally, the saw is equipped with a triple nozzle system arranged symmetrically on either side of the blade shown in the figure, and fixed relative to the saw blade.

The setting of the round jetting nozzles (jet diameter approximately 1 mm) was determined in preliminary trials. The nozzles were vertically and horizontally adjustable in their holders and their settings were chosen such that the areas in which the jets glance the side surfaces of the saw blade on impact are spaced apart radially by a distance corresponding approximately to the workpiece radius. In this arrangement the lowest jet came into contact with the saw blade at a distance calculated from the cutting edge of approximately 0.1 cm, the middle jet at approximately 1.5 cm and the outer jet at a distance of approximately 7 cm. In addition, the point of impact was chosen such that the smallest distance with respect to the outer periphery of the workpiece during the course of the sawing operation was approximately 0.1 cm. The setting capabilities mentioned here are of course only by way of example, and are not to be construed as a limitation.

The nozzles were connected via a hose system to a control system (hand-controlled metering valve with flow sensors), with the aid of which each individual nozzle can be supplied, when required, with a volumetric fluid flow which can be regulated in its intensity. Water, which was provided in a reservoir and connected via hoses to the control system at a pressure of approximately 3 bar, was used as a fluid.

An eddy current-measuring instrument was fixedly attached in the exit area of the cutting edge from the workpiece at a distance of approximately 5 mm from one side surface. With this instrument, the deviation of the saw blade from a predetermined target position could be followed precisely to within approximately 0.5 $\mu$m during the sawing operation, via an indicating panel.

The sawing operation, in which a monocrystalline silicon rod of approximately 150 mm diameter was to be sawn into geometrically perfect wafers of approximately 600 $\mu$m thickness was begun in the usual way by moving the workpiece into the desired cutting position with the aid of the infeed table. Then the cutting edge of the rotating saw blade was vertically moved and brought into contact with the silicon rod and cooling lubricant was continuously supplied as the cutting edge began to penetrate the workpiece.

The deflection of the saw blade was precisely monitored as the sawing operation progressed, with the aid of the eddy current measuring instrument. A deviation of ±15 µm from the initial position had been arbitrarily predetermined as still being the admissible tolerance limit. Optionally, the tolerance limit may also be set closer or wider and depends, as a rule on the specifications of the component producers. If the measuring instrument indicated that the saw blade had begun to deviate by more than 2 µm in a certain direction, then the water jet on the respective opposite side was turned on. The first jet was produced via the lowest nozzle and was directed on the side surface of the saw blade and intensified by the metering valve to such an extent that the saw blade began to move back again. On approaching the target position, the adjustment of the metering valve was retained until a renewed deviation was detected. Upon a deviation in the opposite direction, the volumetric flow was initially reduced and, if need be, countered accordingly from the other side. Additionally, in order to be able to keep the saw blade within the predetermined tolerance limits, the second nozzle had to be used at a cutting depth of approximately 75 mm and at approximately 100 mm, the third nozzle was used as well.

When the saw blade could no longer be kept within the tolerance limit (±15 µm) during the course of the sawing operation in spite of the counteracting control, the cutting edge was resharpened in the known way after completion of the cut. Such sharpening interventions were usually necessary after approximately 40 to 60 sawing operations.

At the end of the cut, each severed wafer was removed by means of a wafer remover and cleaned. The wafer surface was finally examined for its flexure (bow or warp) in a commercially available checking instrument with the aid of a non-contact capacitive measuring method.

To determine the saw blade service life, the same sawing method was continued with the saw blade until satisfactory controllable running with reproducible cutting results could no longer be ensured, even with resharpening. This service life was noted as a comparative value.

COMPARISON EXAMPLE

With a new saw blade, a further series of cuts was carried out in the same arrangement under the same conditions on monocrystalline silicon rods of 150 mm diameter. The difference was that no fluid was applied from the nozzles to the side surfaces of the saw blade during the sawing operation. In the event of deviations exceeding ±15 µm from the target cutting line, the cutting edge was resharpened by the conventional method. This operation had to be repeated after 10 to 15 sawing operations in each case.

The service life of this saw blade, i.e, the operating time within which satisfactory running and reproducible cutting results could b achieved, was only approximately 60% of the standard value set by the process according to the invention. This result was due to the considerably more frequent sharpening interventions necessary. The geometry of the wafers obtained was likewise checked with the aid of the non-contact capacitive measuring method.

In this check, the deviation of the wafer surface from an ideal center line limiting it, known as "warp", was determined as a characteristic quantity. The value maintained or kept lower than for 97.5% of the wafers obtained in such a way was 6 µm higher than the corresponding value for the wafers sawn by the process according to the present invention.

While several embodiments and examples of the present invention have been described and/or shown, it is obvious that many changes and modifications may be made thereunto, without departing from the spirit and scope of the invention.

What is claimed:

1. A process for sawing crystal rods or blocks into thin wafers by means of an internal-hole saw having a liquid cooling lubricant being applied to a cutting edge of a rotary saw blade which forms a saw cut during the cutting operation, further comprising the step of:
   directing an additional fluid, at least periodically, onto at least one side surface of the saw blade while the rotating saw blade is within the cut, at a point on the saw blade prior to its entering the saw cut, when the measured cutting line deviates from a predetermined cutting line by greater than a predetermined variation to produce a force within the cut capable of moving the saw blade toward the predetermined cutting line.

2. The process as claimed in claim 1, wherein the fluid is applied to said side surfaces by means of nozzles arranged symmetrically on either side of the saw blade.

3. The process as claimed in claim 1 wherein the fluid is applied to said side surfaces virtually parallel to the same with respect to the saw blade.

4. The process as claimed in claim 1 wherein the fluid is directed at an angle of less than 30° with respect to said one or both side surfaces of said rotating saw blade.

5. The process as claimed in claim 1 wherein said fluid used is an aqueous system.

6. The process as claimed in claim 1 wherein said fluid used is air.

7. A internal-hole saw for forming a saw cut in a workpiece comprising:
   an annular saw blade having a cutting edge on its inner circumference;
   an infeed table, including means for fixing the workpiece thereon within the inner hole of said annular saw blade, said infeed table capable of moving said workpiece into contact with said cutting edge of said saw blade;
   means for supplying a cooling lubricant, via supply lines, to said saw blade;
   at least one supply element which is arranged at least one side of said saw blade for directing a fluid onto said at least one side surface of the saw blade while the rotating saw blade is within the cut, at a point on the saw blade prior to its entering the saw cut, when the measured cutting line deviates from the predetermined cutting line by greater than a predetermined deviation.

8. The internal-hole saw as claimed in claim 7, wherein said means for supplying cooling lubricant further comprises two nozzle systems as supply elements arranged symmetrically on either side of the saw blade and connected to metering devices and a fluid reservoir.

9. A process for sawing crystal rods or blocks into thin wafers by means of an internal-hold saw having a liquid cooling lubricant being applied to a cutting edge of a rotating saw blade which forms a saw cut during the cutting operation, comprising the steps of:

feeding the crystal rods or blocks into contact with said rotating cutting edge to form the saw cut along an intended cutting line;

sensing the deviation of the rotating saw blade from the intended cutting line;

applying an additional fluid, in response to said sensed deviation, to one or both sides of the saw blade to create a pressure differential in the cut which tends to draw the saw blade towards said intended cutting line; and, controlling the volumetric flow of said additional fluid and the impingement angle thereof on said saw blade in response to said sensed deviation.

10. The process as set forth in claim 9 further including the step of metering said additional fluid flow on one or both sides of the saw blade in response to said sensed deviation.

11. An internal-hole saw as set forth in claim 7, wherein the fluid is a liquid.

12. A process for controlling the deviation of a saw blade of an internal-hole saw during the cutting operation from a predetermined cutting line, comprising:

measuring the cutting line of the saw blade while the blade rotates within the saw cut;

comparing the measured cutting line of the saw blade with the predetermined cutting line of the saw blade;

directing a fluid onto at least one side surface of the saw blade while the rotating saw blade is within the cut at a point on the saw blade prior to its entering the saw cut when the measured cutting line deviates from the predetermined cutting line by greater than a predetermined deviation; and adjusting the volumetric fluid flow of the fluid applied to the at least one side of the saw blade as the saw blade rotates within the cut to produce a force within the cut capable of moving the saw blade toward the predetermined cutting line.

* * * * *